US008616043B2

(12) United States Patent
Cruse et al.

(10) Patent No.: US 8,616,043 B2
(45) Date of Patent: Dec. 31, 2013

(54) METHODS AND APPARATUS FOR CALIBRATING PRESSURE GAUGES IN A SUBSTRATE PROCESSING SYSTEM

(75) Inventors: James P. Cruse, Santa Cruz, CA (US); Ezra Robert Gold, Sunnyvale, CA (US); Jared Ahmad Lee, Santa Clara, CA (US); Ming Xu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 446 days.

(21) Appl. No.: 12/916,450

(22) Filed: Oct. 29, 2010

(65) Prior Publication Data

US 2011/0265899 A1    Nov. 3, 2011

Related U.S. Application Data

(60) Provisional application No. 61/330,058, filed on Apr. 30, 2010.

(51) Int. Cl.
    *G01L 27/02*    (2006.01)
(52) U.S. Cl.
    USPC .............................. 73/1.61; 73/1.62; 73/1.64
(58) Field of Classification Search
    USPC ........................................ 73/1.58, 1.59–1.64
    See application file for complete search history.

(56) References Cited

U.S. PATENT DOCUMENTS

| 4,590,791 | A | * | 5/1986 | Reed et al. .................... 73/1.61 |
| 5,461,901 | A | * | 10/1995 | Ottestad .......................... 73/1.63 |
| 7,043,960 | B1 | * | 5/2006 | Lueck ............................ 73/1.63 |
| 2002/0002856 | A1 | * | 1/2002 | Kenney et al. ................. 73/1.63 |
| 2012/0239307 | A1 | * | 9/2012 | Borenstein ...................... 702/23 |

FOREIGN PATENT DOCUMENTS

SU    1441212 A    * 11/1988

OTHER PUBLICATIONS

Product Data Sheet PBMS2B—Jan. 2008 "Type PBMS2B Two-Channel Portable Baratron® Measurement System" © 2003 MKS Instruments, Inc.

* cited by examiner

*Primary Examiner* — Hezron E Williams
*Assistant Examiner* — Nashmiya Fayyaz
(74) *Attorney, Agent, or Firm* — Moser Taboada; Alan Taboada

(57) ABSTRACT

Systems and methods for calibrating pressure gauges in one or more process chambers coupled to a transfer chamber having a transfer volume is disclosed herein. The method includes providing a first pressure in the transfer volume and in a first inner volume of a first process chamber coupled to the transfer chamber, wherein the transfer volume and the first inner volume are fluidly coupled, injecting a calibration gas into the transfer volume to raise a pressure in the transfer volume and in the first inner volume to a second pressure, measuring the second pressure using each of a reference pressure gauge coupled to the transfer chamber and a first pressure gauge coupled to the first process chamber while the transfer volume and the first inner volume are fluidly coupled, and calibrating the first pressure gauge based on a difference in the measured second pressure between the reference pressure gauge and the first pressure gauge.

18 Claims, 4 Drawing Sheets

METHODS AND APPARATUS FOR CALIBRATING PRESSURE GAUGES IN A SUBSTRATE PROCESSING SYSTEM

CROSS-REFERENCE TO RELATED APPLICATIONS

This application claims benefit of U.S. provisional patent application Ser. No. 61/330,058, filed Apr. 30, 2010, which is herein incorporated by reference.

FIELD

Embodiments of the present invention generally relate to substrate processing equipment.

BACKGROUND

During substrate processing, such as etching process, an inner volume of a process chamber may be exposed to one or more process gases. Often, such processing is performed at a controlled pressure. Pressure gauges may be used to monitor the pressure in the inner volume. Currently, a reference pressure gauge is used to approximately calibrate the pressure gauge to a zero point. Unfortunately, such calibration is typically provides an accuracy of about +/−15% or so. The inventors have observed that there is typically no on-tool apparatus available on a multi-chamber substrate processing system, such as a cluster tool, for checking the pressure gauges of each chamber for drift or for comparing drift between pressure gauges on adjacent chambers of the system. In addition, the inventors have further observed that no practical external devices are available to perform this calibration task in a timely manner.

Accordingly, the inventors have provided a system and methods disclosed herein for calibrating pressure gauges in one or more process chambers of a multi-chamber substrate processing system.

SUMMARY

Systems and methods for calibrating pressure gauges in one or more process chambers of a multi-chamber substrate processing system are provided herein. In some embodiments, a substrate processing system may include a transfer chamber having a transfer volume; a plurality of process chambers coupled to the transfer chamber, a reference pressure gauge coupled to the transfer chamber and selectively coupled to the transfer volume; a calibration gas supply coupled to the transfer chamber to selectively supply a calibration gas to the transfer volume; and a vacuum pump coupled to the transfer volume. Each process chamber may include an inner volume selectively coupled to the transfer volume; a pressure gauge coupled to each inner volume; a vacuum pump; and a pumping port fluidly coupling the inner volume to the vacuum pump. In some embodiments, the substrate processing system may further include a controller to control the operation of the substrate processing system and to cause the substrate processing system to calibrate each of the pressure gauges of the plurality of process chambers using any of the methods described herein.

In some embodiments, a method for calibrating a pressure gauge in one or more process chambers coupled to a transfer chamber having a transfer volume includes providing a first pressure in the transfer volume and in a first inner volume of a first process chamber coupled to the transfer chamber, wherein the transfer volume and the first inner volume are fluidly coupled, injecting a calibration gas into the transfer volume to raise a pressure in the transfer volume and in the first inner volume to a second pressure, measuring the second pressure using each of a reference pressure gauge coupled to the transfer chamber and a first pressure gauge coupled to the first process chamber while the transfer volume and the first inner volume are fluidly coupled, and calibrating the first pressure gauge based on a difference in the measured second pressure between the reference pressure gauge and the first pressure gauge.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
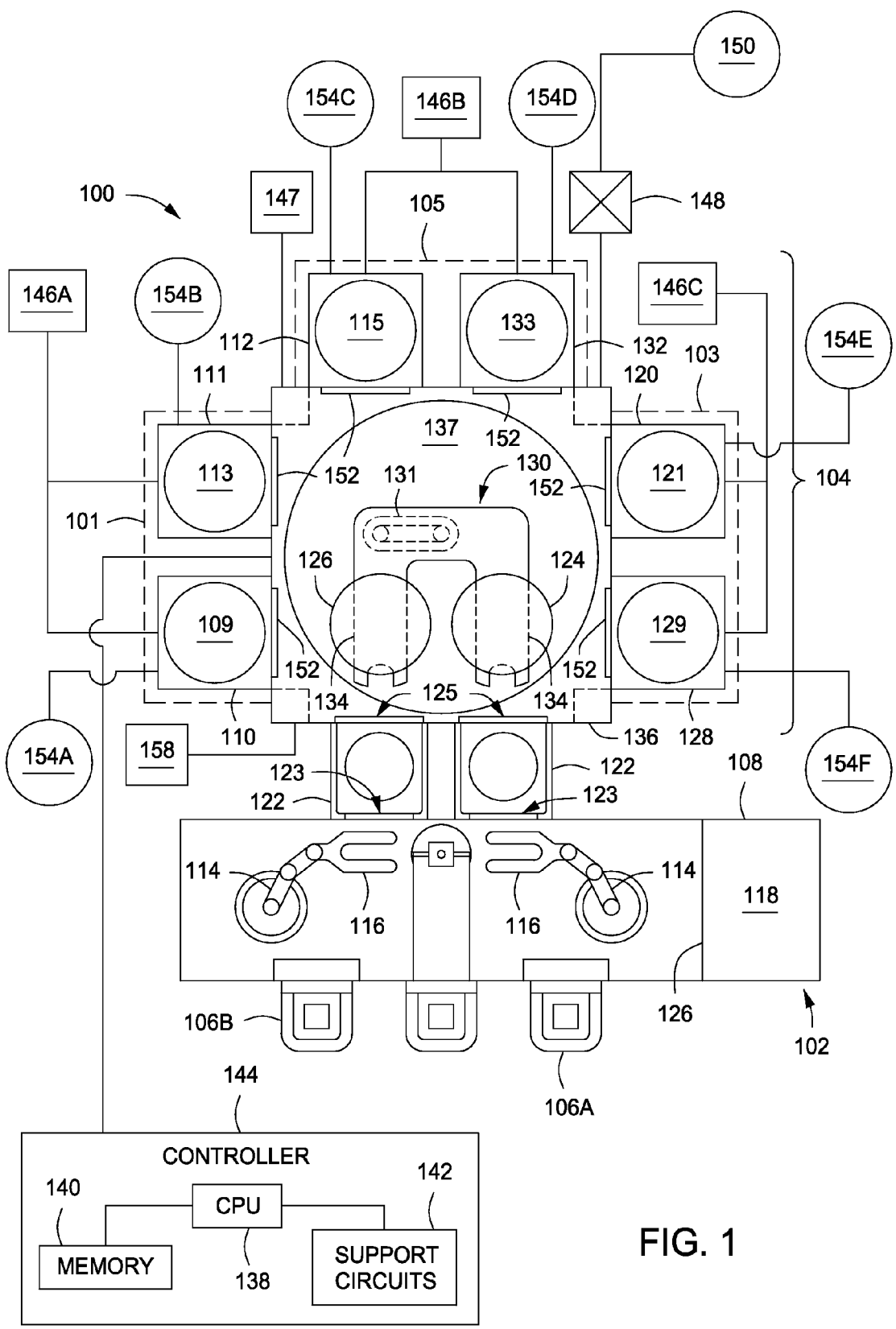
FIG. 1 depicts a schematic top view of a multi-chamber substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Systems and methods for calibrating pressure gauges in one or more process chambers coupled to a cluster tool are disclosed herein. The inventive systems and methods advantageously facilitate measuring one or more pressures across and in direct comparison to both a reference standard and to other pressure gauges coupled to the one or more process chambers while directly on the cluster tool. The inventive systems and methods thus may advantageously provide decreased time required to calibrate each of the pressure gauges and improved uniformity between the pressure gauge measurements, thereby facilitating improved chamber matching (e.g., improved uniformity of process results between two different chambers operating under similar process conditions).

Referring to FIG. 1, in some embodiments, a cluster tool, or processing system 100 may generally comprise a factory interface 102, a vacuum-tight processing platform 104, and a system controller 144. Examples of a processing system that may be suitably modified in accordance with the teachings provided herein include the Centura® integrated processing system, one of the PRODUCER® line of processing systems (such as the PRODUCER® GT™), ADVANTEDGE™ processing systems, or other suitable processing systems commercially available from Applied Materials, Inc., located in Santa Clara, Calif. It is contemplated that other processing systems (including those from other manufacturers) may be adapted to benefit from the invention. One example of a twin chamber processing system that may be modified to incorporate the present invention in accordance with the teachings herein is described in U.S. Provisional Patent Application Ser. No. 61/330,156, filed Apr. 30, 2010, by Ming Xu, et al., and entitled, "Twin Chamber Processing System."

The platform 104 may include a plurality of processing chambers (six shown) 110, 111, 112, 132, 128, 120 and at least one load-lock chamber (two shown) 122 that are coupled to a transfer chamber 136. Each process chamber includes a slit valve 152 or other selectively sealable opening to selectively fluidly couple the respective inner volumes of the process chambers to the inner volume of the transfer chamber 136. Similarly, each load lock chamber 122 includes a port 125 to selectively fluidly couple the respective inner volumes of the load lock chambers 122 to the inner volume of the transfer chamber 136. The factory interface 102 is coupled to the transfer chamber 136 via the load lock chambers 122.

In some embodiments, for example, as depicted in FIG. 1, the processing chambers 110, 111, 112, 132, 128, 120 may be grouped in pairs with each of the processing chambers 110 and 111, 112 and 132, and 128 and 120 in each pair positioned adjacent to one another. In some embodiments, each pair of process chambers may be part of a twin chamber processing system (101, 103, 105) where each respective pair of process chambers may be provided in a common housing with certain shared resources provided, as discussed herein. Each twin chamber processing system 101, 103, 105 may include a pair of independent processing volumes that may be isolated from each other. For example, each twin chamber processing system may include a first process chamber and a second process chamber, having respective first and second processing volumes. The first and second processing volumes may be isolated from each other to facilitate substantially independent processing of substrates in each respective process chamber. The isolated processing volumes of the process chambers within the twin chamber processing system advantageously reduces or eliminates processing problems that may arise due to multi-substrate processing systems where the processing volumes are fluidly coupled during processing.

In addition, the twin chamber processing system further advantageously utilizes shared resources that facilitate reduced system footprint, hardware expense, utilities usage and cost, maintenance, and the like, while at the same time promoting higher substrate throughput. For example, as shown in FIG. 1, the processing chambers may be configured such that processing resources 146A, 146B, 146C (collectively 146) (i.e., process gas supply, power supply, vacuum pumping systems or the like) may be respectively shared between each of the processing chambers 110 and 111, 112 and 132, and 128 and 120, and/or within each pair of processing chamber in each twin processing system 101, 103, 105. Other examples of shared hardware and/or resources may include one or more of a process foreline and roughing pump, AC distribution and DC power supplies, cooling water distribution, chillers, multi-channel thermo controllers, gas panels, controllers, and the like.

In some embodiments, the factory interface 102 comprises at least one docking station 108 and at least one factory interface robot (two shown) 114 to facilitate transfer of substrates. The docking station 108 is configured to accept one or more (two shown) front opening unified pods (FOUPs) 106A-B. In some embodiments, the factory interface robot 114 generally comprises a blade 116 disposed on one end of the robot 114 configured to transfer the substrates from the factory interface 102 to the processing platform 104 for processing through the load lock chambers 122. Optionally, one or more metrology stations 118 may be connected to a terminal 126 of the factory interface 102 to facilitate measurement of the substrates from the FOUPs 106A-B.

In some embodiments, each of the load lock chambers 122 may comprise a first port 123 coupled to the factory interface 102 and a second port 125 coupled to the transfer chamber 136. The load lock chambers 122 may be coupled to a pressure control system which pumps down and vents the load lock chambers 122 to facilitate passing the substrates between the vacuum environment of the transfer chamber 136 and the substantially ambient (e.g., atmospheric) environment of the factory interface 102.

In some embodiments, the transfer chamber 136 has a vacuum robot 130 disposed therein. The vacuum robot 130 generally comprises one or more transfer blades (two shown) 134 coupled to a movable arm 131. In some embodiments, for example where the processing chambers 110, 111, 112, 132, 128, 120 are arranged in groups of two, as depicted FIG. 1, the vacuum robot 130 may have two parallel transfer blades 134 configured such that the vacuum robot 130 may simultaneously transfer two substrates 124, 126 from the load lock chambers 122 to each pair of processing chambers (110 and 111, 112 and 132, and 128 and 120).

The processing chambers 110, 111, 112, 132, 128, 120 may be any type of process chamber utilized in substrate processing. However, to utilize the shared resources, each pair of processing chambers is the same type of chamber, such as an etch chamber, a deposition chamber, or the like. Non-limiting examples of suitable etch chambers that may be modified in accordance with the teachings provided herein include any of the Decoupled Plasma Source (DPS) line of chambers, a HART™, E-MAX®, or ENABLER® etch chamber available from Applied Materials, Inc., of Santa Clara, Calif. Other etch chambers, including those from other manufacturers, may be utilized.

Each pair of process chambers 110 and 111, 112 and 132, and 120 and 128 may have shared resources 146A, 146B, or 146C as discussed above. For example, in some embodiments, the shared resources may be a gas panel for providing a process gas or a calibration gas as discussed below. Further, the shared resources may be a shared vacuum pump for pumping down each process chamber in combination with an adjacent chamber or individually. Alternatively or in combination with the shared vacuum pump, each process chamber may include an individual vacuum pump (not shown) for pumping down a inner volume 109, 113, 115, 133, 121, 129 of each process chamber. Each process chamber 110, 111, 112, 132, 120, 128 further includes a pressure gauge 154A, 154B, 154C, 154D, 154E, and 154F (collectively, pressure gauges 154) for monitoring a pressure in each inner volume 109, 113, 115, 133, 121, 129, respectively.

The transfer chamber 136 may include a calibration gas module 147, a vacuum pump 158, and a reference pressure gauge 150 coupled to the transfer chamber 136 via an isolation valve 148 as shown in FIG. 1. For example, the reference pressure gauge 150 may be utilized to monitor a pressure in a transfer volume 137 and/or one or more of the inner volumes 109, 113, 115, 133, 121, 129. The reference pressure gauge 150 may be isolated from the transfer volume 137 of the transfer chamber 136 through the isolation valve 148 disposed between the transfer chamber 136 and the pressure gauge 150 in some embodiments of the inventive methods as discussed below. By providing the reference pressure gauge 150 and the calibration gas module 147 to the transfer chamber 136, each pressure gauge 154A-E may be calibrated, for example, using the methods discussed below with respect to FIGS. 2-3.

The calibration gas module 147 may be utilized to inject a calibration gas into the transfer volume 137 and further into any or all of the inner volumes 109, 113, 115, 133, 121, 129 when each inner volume is fluidly coupled to the transfer volume 137. The calibration gas may be any suitable gas for calibrating pressure gauges, such as an inert gas, such as nitrogen ($N_2$) or a noble gas (e.g., argon (Ar), helium (He), etc.), or the like. In some embodiments, the calibration gas may be a purge gas used to maintain the operating condition of any or all of the processing or transfer subsystems.

Figure 4:
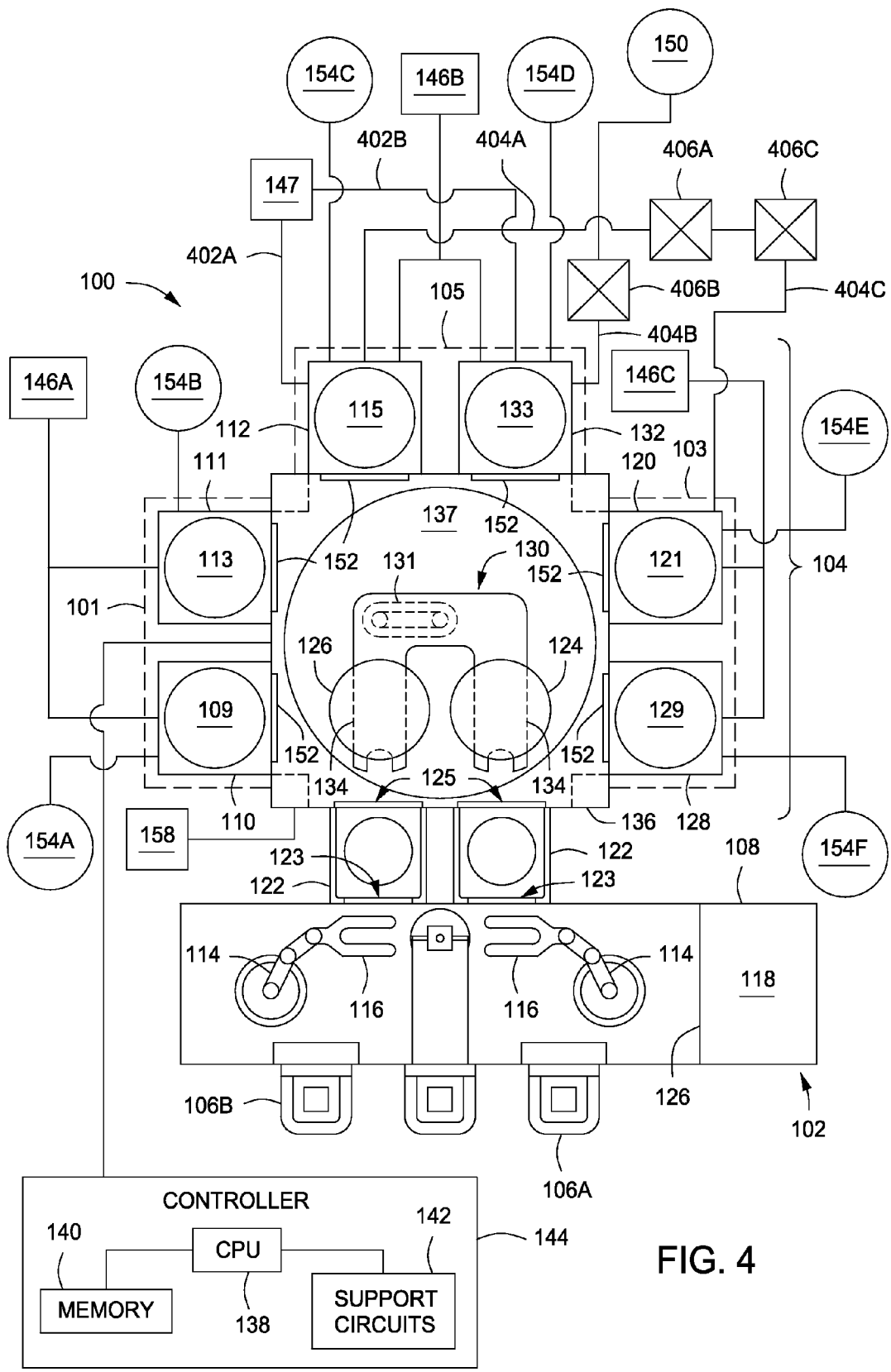
FIG. 4 depicts a schematic top view of a multi-chamber substrate processing system in accordance with some embodiments of the present invention.

Alternatively, and illustrated in an alternative version of the system 110 in FIG. 4, the calibration gas module 147 and the reference pressure gauge 150 may be individually coupled to each process chamber 110, 111, 112, 132, 120, 128 via independent calibration gas lines and independent reference gauge lines, each reference gauge line having an isolation valve. To provide a simplified view in FIG. 4, independent calibration gas lines 402A-C and independent reference gauge lines 404A-C having isolation valves 406A-C respectively are shown coupled to process chambers 112, 132, and 120. However, and not show in FIG. 4, independent calibration gas lines and independent reference lines having isolation valves may be coupled to each of the process chambers 110, 111, 128. Further, the use of independent calibration gas lines 402A-C is optional, and the calibration gas may for example be provided by the shared resources 146A-C. Providing independent calibration gas lines 402A-C and independent reference pressure gauge lines 404A-C advantageously allows calibration of a process chamber when the process chamber is idle even if the transfer chamber 137 is currently in operation.

The vacuum pump 158 may be utilized for reducing a pressure in the transfer volume and further in each inner volume when each inner volume is fluidly coupled to the transfer volume 137. An inner volume may be fluidly coupled to the transfer volume 137, for example, when a slit valve 152 or another means for the substrate 124, 126 to enter each inner volume of each process chamber is in an opened position.

The system controller 144 is coupled to the processing system 100 for controlling the processing system 100 or components thereof. For example, the system controller 144 may control the operation of the system 100 using a direct control of the process chambers 110, 111, 112, 132, 128, 120 of the system 100 or alternatively, by controlling the computers (or controllers) associated with the process chambers 110, 111, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuits 142. The CPU 138 may be one of any form of a general purpose computer processor that can be used in an industrial setting. The memory, or computer-readable medium, 140 is accessible by the CPU 138 and may be one or more of readily available memory such as random access memory (RAM), read only memory (ROM), floppy disk, hard disk, or any other form of digital storage, local or remote. The support circuits 142 are conventionally coupled to the CPU 138 and may comprise cache, clock circuits, input/output subsystems, power supplies, and the like. The inventive methods disclosed herein may generally be stored in the memory 140 (or in memory of a particular process chamber pair, as discussed below) as a software routine that, when executed by the CPU 138, causes the pair of process chambers to perform processes in accordance with the present invention.

Figure 2:
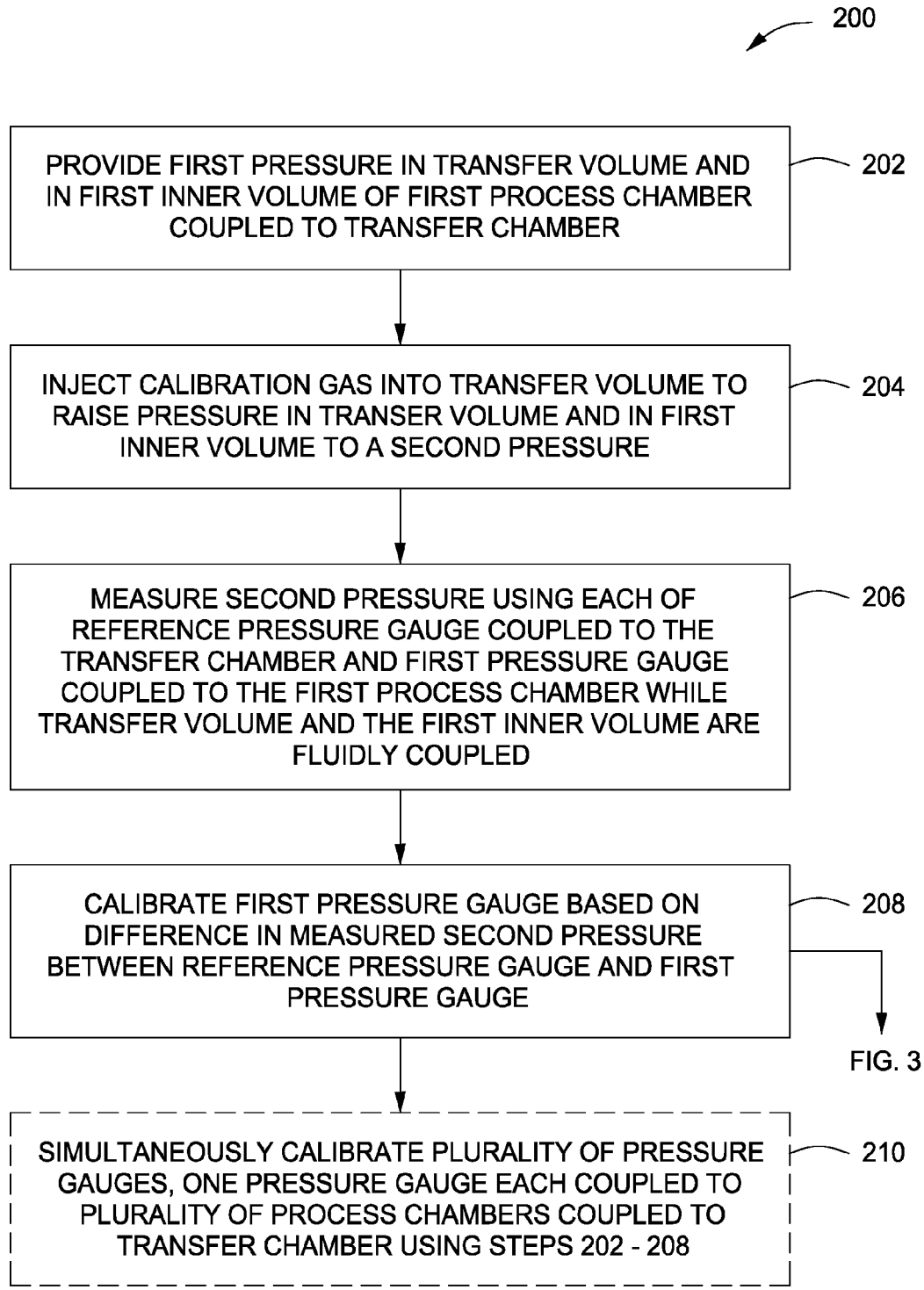
FIG. 2 depicts a flow chart for a method for calibrating a pressure gauge in one or more process chambers of a multi-chamber substrate processing system in accordance with some embodiments of the present invention.
Figure 3:
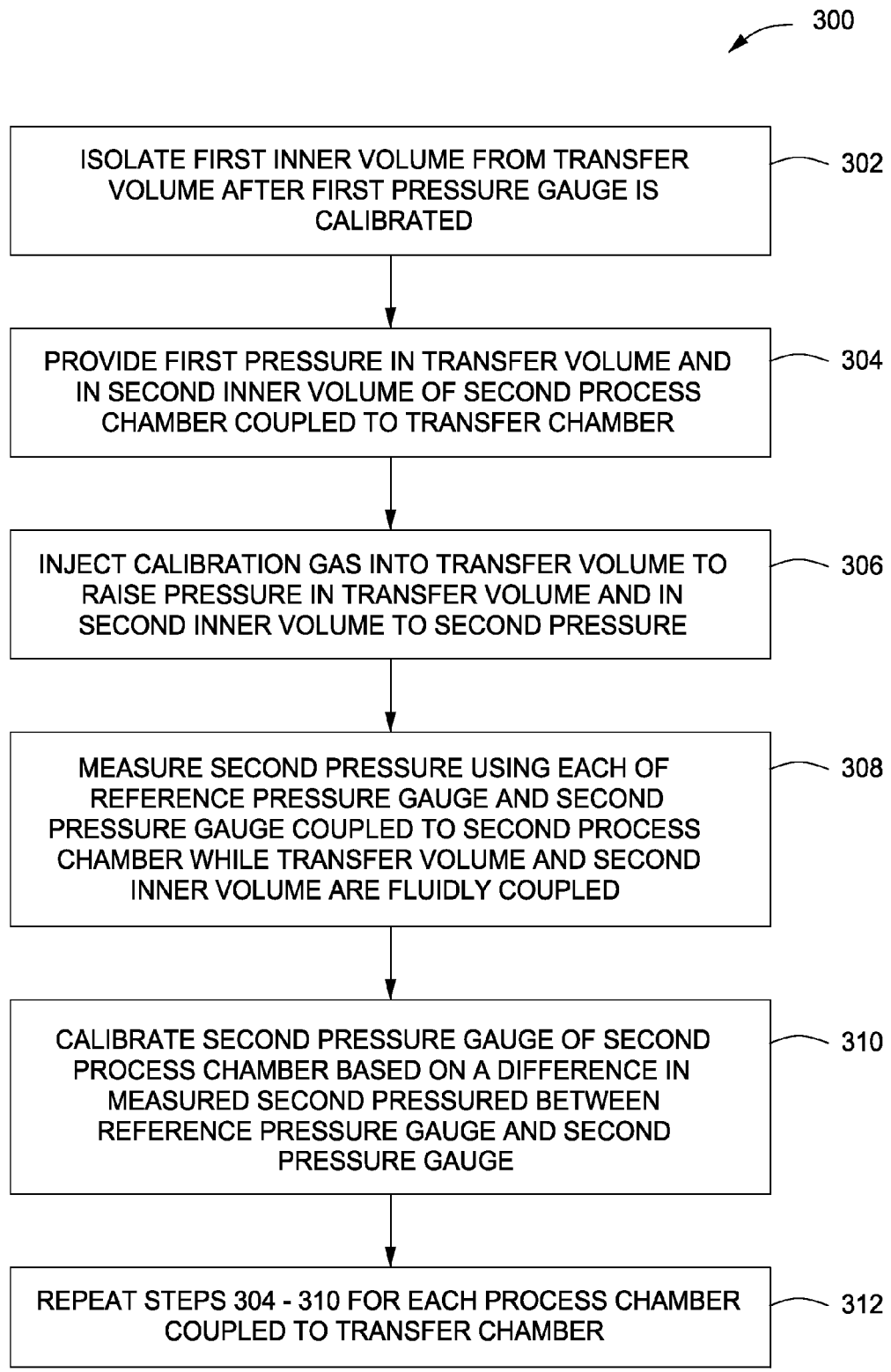
FIG. 3 depicts a flow chart for a method for calibrating a pressure gauge in one or more process chambers of a multi-chamber substrate processing system in accordance with some embodiments of the present invention.

FIG. 2 depicts a flow chart of a method 200 for calibrating a pressure gauge in one or more process chambers coupled to a transfer chamber having a transfer volume in accordance with some embodiments of the present invention. The method 200 is illustratively described below with respect to the processing system 100 as illustrated in FIG. 1. The inventive methods discussed below may be used in other processing systems modified in accordance with the teachings disclosed herein.

The method 200 generally begins at 202 by providing a first pressure in a transfer volume and in first inner volume of a first process chamber coupled to a transfer chamber. For example, the first pressure may be provided in the transfer volume 137 and in the inner volume 109 of the process chamber 110 coupled to the transfer chamber 136. The first pressure may be provided in the transfer volume 137 and in the inner volume 109 of the process chamber 110 simultaneously or sequentially, and when the respective volumes are fluidly coupled or isolated from each other.

For example, in some embodiments, the first pressure in the inner volume 109 of the process chamber 110 may be provided while the inner volume 109 is isolated from the transfer volume 137 (e.g., when the slit valve 152 is closed). For example, while the slit valve 152 is closed, a pressure in the inner volume 109 may be reduced to the first pressure by a shared vacuum pump (such as part of the shared resource 146A) and/or an individual vacuum pump (not shown) coupled to the process chamber 110 for reducing pressure in the inner volume 109.

Similarly, in some embodiments, the first pressure in the transfer volume 137 may be provided by reducing the pressure in the transfer volume 137 to the first pressure when isolated from the process chamber 110. For example, the pressure in the transfer volume 137 may be reduced to the first pressure using the vacuum pump 158. After the first pressure is achieved in both the inner volume 109 and the transfer volume 137, the inner volume 109 and the transfer volume 137 may be fluidly coupled, for example, by opening the slit valve 152 of the process chamber 110.

Alternatively, after the inner volume 109 is reduced to the first pressure, the inner volume 109 may be fluidly coupled to the transfer volume 137 prior to reducing the pressure in the transfer volume 137 to the first pressure. In such embodiments, the first pressure in the transfer volume 137 may be provided using the vacuum pump 158, a shared or individual vacuum pump of the process chamber 110, or a combination thereof. For example, the pressure in the inner volume 109 may be reduced to the first pressure prior to opening the slot valve 152 to fluidly couple the inner volume 109 to the transfer volume 137 in order to avoid contaminants, residuals or the like from entering the transfer volume 137, which could undesirably lead to corrosion of surfaces or components of the transfer chamber 136, such as the reference pressure gauge 150.

In some embodiments, the reference pressure gauge 150 may be isolated from the transfer volume 137 via the isolation valve 148 to avoid potential exposure to contaminants or particles until the pressure in the transfer volume 137 reaches the first pressure. For example, the reference gauge 150 may be fluidly coupled to the transfer volume 137 by opening the isolation valve 148 after the first pressure has been reached in the transfer volume 137, or after the first pressure has been reached in the inner volume 109 and the inner volume 109 and the transfer volume 137 are fluidly coupled.

In some embodiments, after reducing the pressure in the inner volume 109 and the transfer volume 137 by any of the methods discussed above and after fluidly coupling the reference gauge 150 to the transfer volume by opening the isolation valve 148, the transfer volume 137 and the inner volume 109 may be isolated from the one or more vacuum pumps used to reduce the transfer volume 137 and the inner volume 109 to the first pressure prior to beginning step 204 as discussed below. The one or more vacuum pumps may be isolated, for example, to limit false readings in any of the pressure gauges 154A-F and/or the reference pressure gauge 150 due to pressure fluctuations and/or asymmetries that may be caused by the one or more vacuum pumps.

Next, at 204, while the inner volume 109 and the transfer volume 137 are still fluidly coupled, a calibration gas may be injected into the transfer volume 137 to raise the pressure in the transfer volume 137 and in the inner volume 109 to a second pressure. For example, the calibration gas may be provided from the calibration gas module 147 to the transfer volume 137 to raise the pressure to the second pressure. The calibration gas may be any suitable calibration gas as discussed above.

At 206, the second pressure may be measured using the reference pressure gauge 150 (coupled to the transfer chamber 136) and the pressure gauge 154A (coupled to the process chamber 110) while the transfer volume 137 and the inner volume 109 are fluidly coupled. For example, at 206, the reference gauge 150 and the pressure gauge 154A are measuring the second pressure in the combined volume of the transfer volume 137 and the inner volume 109.

In some embodiments, measuring the second pressure may include measuring a second plurality of outputs from the pressure gauge 154A at the second pressure and determining an average value for the second plurality. For example, a span correction factor may be determined for the pressure gauge 154A by dividing a reference output measured at the second pressure by the reference pressure gauge 150 and normalized by a reference zero offset of the reference pressure gauge 150 by the average value of the second plurality normalized by the zero offset of the pressure gauge 154A multiplied by a linearity factor for the pressure gauge 154A. If the determined span correction factor exceeds the current span correction factor of the pressure gauge 154A by more than about +/−0.001 percent, the pressure gauge 154A may require calibration as discussed at 208 below.

In some embodiments, a zero calibration may be performed on the pressure gauge 154A. In some embodiments, prior to injecting a calibration gas at 204, a zero calibration may be performed on the pressure gauge 154A. The zero calibration may be any suitable calibration technique for verifying or correcting the zero offset for the pressure gauge. For example, the zero calibration may be performed at the first pressure or at any desired pressure. For example, if performed at the first pressure, the zero calibration may include monitoring an output of the pressure gauge 154A over a first period until a rate of change in the output per second is less than a predetermined amount, for example, about 0.002 percent of a full scale for the pressure gauge 154A. In some embodiments, the first period may be about 60 seconds or more. If the rate of change in the output per second is not less than a predetermined amount, such as about 0.002 percent of the full scale, within a predetermined period, for example of about 300 seconds, then a fault may be issued that a steady state of the pressure gauge 154A could not be reached in a time allotted. If such as case arises, the pressure gauge 154A may require replacement.

In embodiments of the zero calibration where steady state is reached, the zero calibration may proceed by measuring a first plurality of outputs from the first pressure gauge at the first pressure. From the first plurality of outputs an average value for the output and a standard deviation from the average value may be determined. If the standard deviation is within a predetermined amount, such as about 0.010 percent of the average value of the first plurality, then a zero offset of the pressure gauge 154A need not be adjusted. If the standard deviation ranges from greater than about 0.010 percent to about 0.02 percent of the average value of the first plurality, then the zero offset may be reset to the standard deviation. If the standard deviation exceeds about 0.02 percent of the average value of the first plurality, then the warning may be issued to replace the pressure gauge 154A. In some embodiments, if the standard deviation exceeds about 5 percent of a full scale for the pressure gauge 154A, then the pressure gauge 154A may require replacement. In some embodiments, the default value of the zero offset should be about 0.000. In some embodiments, a corrected manometer value may be used for control of the pressure gauge and may be displayed by the user interface. The corrected pressure gauge value may also include an intentional bias called a base pressure gauge offset. In some embodiments, the default value of the base pressure gauge offset may be 0.25 mTorr, but other values may also be used.

At 208, the pressure gauge 154A may be calibrated based on any difference in the measured second pressure between the reference pressure gauge 150 and the pressure gauge 154A. As the transfer volume 137 and the inner volume 109 are fluidly coupled into a combined volume, the measurement of the second pressure by the reference pressure gauge 150 and the pressure gauge 154A should be identical. As such, in some embodiments, the calibration may include presuming that the second pressure measured by the reference pressure gauge 150 is correct and adjusting the pressure gauge 154A until it reads a substantially equivalent pressure as the second pressure as measured by the reference pressure gauge 150. In some embodiments, the pressure gauge may be verified as being within an acceptable range and not requiring calibration. For example, in some embodiments, the pressure gauge may be found to be within +/−0.15 percent or +/−0.25 percent, or the like.

In some embodiments, calibration of the pressure gauge 154A may include resetting the current span correction factor of the pressure gauge 154A to the determined span correction factor if the determined span correction factor is greater than about 0.001 of the current span correction factor. In some embodiments, the span correction factor may range from about 0.950 to about 1.050. In some embodiments, if the determined span correction factor exceeds either side of the range from about 0.950 to about 1.050, then the pressure gauge 154A may require replacement. A default value of a span correction factor for the pressure gauge 154A may be about 1.000.

In some embodiments, after measuring the second pressure at 206, the calibration gas may be subsequently injected into the transfer chamber to raise the pressure from the second pressure to one or more desired pressures. Each of the one or more desired pressures can be measured by each of the reference pressure gauge 150 and the pressure gauge 154A. The pressure gauge 154A may be calibrated based on a difference in each of the measured one or more pressures between the reference pressure gauge 150 and the pressure gauge 154A.

For example, the calibration may be based on the difference in rate of change in pressure over the range of pressures measured between the reference pressure gauge 150 and the pressure gauge 154A, or the like.

In some embodiments, after measuring the second pressure at 206, the pressure may be lowered from the second pressure to one or more desired pressures. Each of the one or more desired pressures can be measured by each of the reference pressure gauge 150 and the pressure gauge 154A. In some embodiments, measuring each of the one or more desired pressures may include measuring a second plurality of outputs at each of the one or more desired pressures from the pressure gauge 154A. An average value from the second plurality may be determined at each of the one or more desired pressures. A linearity factor may be determining for the pressure gauge 154A at each the one or more desired pressures (and the second pressure) by dividing a reference output measured at each of the one or more desired pressures by the reference pressure gauge 150 and normalized by a reference zero offset of the reference pressure gauge 150 by the average value at each of the one or more desired pressures normalized by the zero offset of each pressure gauge. Calibration of the pressure gauge 154A may include resetting a current linearity factor of the pressure gauge 154A at each of the one or more desired pressures (and the second pressure) to the determined linearity factor at each of the one or more desired pressures (and the second pressure). For example, resetting the linearity factor may occur during a periodic recalibration, a replacement of the pressure gauge, or the like.

At 210, optionally and in some embodiments, a plurality of pressure gauges may be simultaneously calibrated using the methods discussed above at 202-208. In some embodiments, two or more of the pressure gauges 154A-F, or all of the pressure gauges 154A-F may be calibrated simultaneously using the methods discussed above at 202-208. For example, the first pressure may be provided to the inner volume 115 of the process chamber 113, the calibration gas may be injected into the transfer volume 137 to raise the pressure in the inner volume 113 to the second pressure, the second pressure may be measured using the pressure gauge 154B and the pressure gauge 154B may be calibrated based on a difference in the measured second pressure between the reference pressure gauge 150 and the pressure gauge 154B. Further, the transfer volume 137, the inner volume 109 and the inner volume 113 may be fluidly coupled while measuring the second pressure. Other embodiments of the method 200 as discussed above, such a raising the second pressure to one or more desired pressures, and the like may also be performed during the simultaneous calibration of the plurality of pressure gauges 154A-F.

Alternatively, in some embodiments, a plurality of the pressure gauges 154A-F, or all of the pressure gauges, may be calibrated in series. For example, a method 300 may include 202-208 of the method 200 discussed above where the pressure gauge 154A is calibrated, and then may proceed to 302 where the inner volume 109 of the process chamber 110 is isolated from the transfer volume after the pressure gauge 154A has been calibrated. For example, the inner volume 109 may be isolated from the transfer volume 137 by the slit valve 152 coupled to the process chamber 110 or the like as discussed above.

At 304, the first pressure may be provided in the transfer volume 137 and in the inner volume 113 of the process chamber 111. For example, the first pressure may be provided to the transfer volume 137 and the inner volume 113 using any of the embodiments for providing the first pressure to the inner volume 109 and the transfer volume 137 as discussed above at 202.

At 306, the calibrating gas may be injected into the transfer volume 137 to raise pressure in the transfer volume 137 and in the inner volume 113 to the second pressure. The calibrating gas may be injected into the transfer volume 137 using any of the embodiments for injecting the calibration gas as discussed above at 204.

At 308, the second pressure may be measured using each of the reference pressure gauge 150 and the pressure gauge 154B coupled to process chamber 111 while transfer volume and the second inner volume are fluidly coupled. The second pressure may be measured using any of the embodiments for measure the second pressure as discussed above at 206.

At 310, the pressure gauge 154B of the process chamber 111 may be calibrated based on a difference in measured second pressure between the reference pressure gauge 150 and the pressure gauge 154B.

Optionally, at 312, each of 304-310 may be repeated in series for some or all of the remaining process chambers 112, 132, 120, 128. For example, the inner volume 113 may be isolated from the transfer volume 137 after the pressure gauge 154B has been calibrated, and the first pressure may be provided to the transfer volume 137 and the inner volume 115 of the process chamber 112 to begin the method steps leading to the calibration of the pressure gauge 154C.

Further, the method 300 may be adapted to be utilized with the alternative embodiments of the system 100 illustrated in FIG. 4. For example, the method 300 may be performed with the system 100 as illustrated in FIG. 4 but with any portion of the method involving the transfer volume 137 may be omitted and at 302, the first processing volume, for example, the inner volume 115 of the process chamber 112 may be isolated from the reference pressure gauge 150 by closing the isolation valve 406A after the pressure gauge 154C has been calibrated.

Thus, systems and methods for calibrating a pressure gauge in one or more process chambers coupled to a transfer chamber having a transfer volume is disclosed herein. The inventive systems and methods advantageously facilitate measuring one or more pressures across and in direct comparison to both a reference standard and to other pressure gauges coupled to the one or more process chambers while directly on the cluster tool. The inventive systems and methods thus may advantageously provide decreased time required to calibrate each of the pressure gauges and improved uniformity between the pressure gauge measurements, thereby facilitating improved chamber matching (e.g., improved uniformity of process results between two different chambers operating under similar process conditions).

While the foregoing is directed to embodiments of the present invention, other and further embodiments of the invention may be devised without departing from the basic scope thereof.

The invention claimed is:

1. A method for calibrating a pressure gauge in one or more process chambers coupled to a transfer chamber having a transfer volume, comprising:

providing a first pressure in the transfer volume and in a first inner volume of a first process chamber coupled to the transfer chamber, wherein the transfer volume and the first inner volume are fluidly coupled;

measuring a first plurality of outputs from a first pressure gauge coupled to the first process chamber at the first pressure;

determining a standard deviation from an average value of the first plurality of outputs;

resetting a zero offset of the first pressure gauge to the standard deviation if the standard deviation range is greater than a predetermined percentage of the average value;

injecting a calibration gas into the transfer volume to raise the first pressure in the transfer volume and in the first inner volume to a second pressure;

measuring the second pressure using each of a reference pressure gauge coupled to the transfer chamber and the first pressure gauge coupled to the first process chamber while the transfer volume and the first inner volume are fluidly coupled; and comparing the second pressure measured by the reference pressure gauge to the second pressure measured by the first pressure gauge.

2. The method of claim 1, further comprising:
calibrating the first pressure gauge based on a difference in the measured second pressure between the reference pressure gauge and the first pressure gauge.

3. The method of claim 1, wherein comparing the second pressure measured further comprises:
measuring a second plurality of outputs from the first pressure gauge at the second pressure and determining an second average value for the second plurality; and
determining a span correction factor for the first pressure gauge by dividing a reference output measured at the second pressure by the reference pressure gauge and normalized by a reference zero offset of the reference pressure gauge by the second average value normalized by the zero offset of the first pressure gauge multiplied by a linearity factor for the first pressure gauge, wherein calibrating the first pressure gauge further comprises:
resetting a current span correction factor of the first pressure gauge to the determined span correction factor if the determined span correction factor is greater than a predetermined percentage of the current span correction factor.

4. The method of claim 1, further comprising:
verifying that a difference in the measured second pressure between the reference pressure gauge and the first pressure gauge is less than a predetermined amount.

5. The method of claim 1, wherein providing the first pressure comprises:
reducing a pressure in the first inner volume to the first pressure while the first inner volume is isolated from the transfer volume; and
reducing a pressure in the transfer volume of the transfer chamber to the first pressure.

6. The method of claim 5, wherein providing the first pressure further comprises:
fluidly coupling the first inner volume and the transfer volume after the first inner volume is reduced to the first pressure and prior to reducing the pressure in the transfer volume to the first pressure, or fluidly coupling the first inner volume and the transfer volume after each of the first inner volume and the transfer volume are reduced to the first pressure.

7. The method of claim 1, wherein the reference pressure gauge is isolated from the transfer volume prior to providing the first pressure in the transfer volume, and further comprising:
fluidly coupling the reference pressure gauge to the transfer volume after providing the first pressure to the transfer volume; and isolating the transfer volume and the first inner volume from one or more vacuum pumps used to reduce the pressure in the transfer volume and the first inner volume to the first pressure after fluidly coupling the reference pressure gauge to the transfer volume.

8. The method of claim 1, further comprising:
providing the first pressure in a second inner volume of a second process chamber fluidly coupled to the transfer chamber, wherein the transfer volume and the second inner volume are fluidly coupled;
injecting the calibration gas into the transfer volume to raise the first pressure in the second inner volume to the second pressure while the transfer volume and the second inner volume are fluidly coupled;
measuring the second pressure using a second pressure gauge coupled to the second process chamber; and
calibrating the second pressure gauge based on a difference in the measured second pressure between the reference pressure gauge and the second pressure gauge.

9. The method of claim 8, wherein each of the transfer volume, the first inner volume, and the second inner volume are fluidly coupled while injecting the calibration gas and measuring the second pressure.

10. The method of claim 8, further comprising:
isolating the first inner volume from the transfer volume prior to providing the first pressure in the transfer volume and in the second inner volume, and optionally, further comprising:
repeating the isolating, providing the first pressure, injecting the calibration gas, and measuring the second pressure for each process chamber coupled to the transfer chamber; and
calibrating each pressure gauge respectively coupled to each process chamber based on a difference in the measured second pressure between the reference pressure gauge and each pressure gauge.

11. The method of claim 8, wherein the reference pressure gauge is selectively coupled to the first pressure gauge and the second pressure gauge through the transfer chamber or through respective independent gas conduits.

12. The method of claim 1, further comprising:
providing the first pressure in each of a plurality of inner volumes of a plurality of process chambers fluidly coupled to the transfer chamber, wherein the transfer volume and the plurality of inner volumes are fluidly coupled;
wherein injecting the calibration gas further comprises injecting the calibration gas into the transfer volume to raise the first pressure in the plurality of inner volumes to the second pressure while the transfer volume and the plurality of inner volumes are fluidly coupled;
measuring the second pressure using a plurality of pressure gauges, one each coupled to the plurality of process chambers; and
calibrating each of the plurality of pressure gauges based on a difference in the measured second pressure between the reference pressure gauge and the plurality of pressure gauges.

13. The method of claim 12, further comprising:
changing a pressure in the plurality of inner volumes from the second pressure to one or more desired pressures while the transfer volume and the plurality of inner volumes are fluidly coupled; and further comprising:
measuring each of the one or more desired pressures using the plurality of pressure gauges, one each coupled to the plurality of process chambers; and calibrating each of the plurality of pressure gauges based on a difference in each of the measured one or more desired pressures between the reference pressure gauge and the plurality of pressure gauges.

14. The method of claim 13, wherein measuring each of the second pressure and the one or more desired pressures using the plurality of pressure gauges further comprises:
   measuring a second plurality of outputs from each of the plurality of pressures gauges at each of the second pressure and the one or more desired pressures and determining an second average value for the second plurality at each of the second pressure and the one or more desired pressures; and
   determining a linearity factor for each of the plurality of pressure gauges at each of the second pressure and the one or more desired pressures by dividing a reference output measured at each pressure by the reference pressure gauge and normalized by a reference zero offset of the reference pressure gauge by the second average value at each pressure normalized by the zero offset of each pressure gauge, wherein calibrating each of the plurality of pressure gauges further comprises:
      resetting a current linearity factor of each of the plurality of pressure gauges at each of the second pressure and the one or more desired pressures to the determined linearity factor at each pressure.

15. The method of claim 12, wherein the reference pressure gauge is isolated from the transfer volume prior to providing the first pressure in the transfer volume, and further comprising:
   fluidly coupling the reference pressure gauge to the transfer volume after providing the first pressure to and fluidly coupling each of the plurality of inner volumes and the transfer volume; and
   isolating the transfer volume and each of the plurality of inner volumes from one or more vacuum pumps used to reduce the pressure in the transfer volume and in each of the plurality of inner volumes to the first pressure after fluidly coupling the reference pressure gauge to the transfer volume.

16. The method of claim 1, further comprising:
   isolating the transfer volume and the first inner volume from one or more vacuum pumps used to reduce the pressure in the transfer volume and the first inner volume to the first pressure prior to measuring the second pressure.

17. The method of claim 1, further comprising:
   lowering a pressure in the transfer volume and in the first inner volume from the second pressure to one or more desired pressures; and
   measuring each of the one or more desired pressures using each of the reference pressure gauge and the first pressure gauge.

18. The method of claim 15, wherein calibrating the first pressure gauge further comprises:
   calibrating the first pressure gauge based on a difference in each of the measured one or more desired pressures between the reference pressure gauge and the first pressure gauge.

* * * * *